(12) United States Patent
Farkhondeh et al.

(10) Patent No.: US 9,532,450 B2
(45) Date of Patent: Dec. 27, 2016

(54) LOWERING THE SHEET RESISTANCE OF A CONDUCTIVE LAYER

(71) Applicant: Apple Inc., Cupertino, CA (US)

(72) Inventors: Ehsan Farkhondeh, Sunnyvale, CA (US); Joshua G. Wurzel, Sunnyvale, CA (US); Romain A. Teil, San Francisco, CA (US); Steven J. Martisauskas, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 71 days.

(21) Appl. No.: 14/203,161

(22) Filed: Mar. 10, 2014

(65) Prior Publication Data

US 2014/0262466 A1    Sep. 18, 2014

Related U.S. Application Data

(60) Provisional application No. 61/778,019, filed on Mar. 12, 2013.

(51) Int. Cl.
| | |
|---|---|
| *H05K 1/11* | (2006.01) |
| *H05K 3/10* | (2006.01) |
| *H05K 3/22* | (2006.01) |
| *G02F 1/1343* | (2006.01) |
| *G02F 1/1345* | (2006.01) |

(52) U.S. Cl.
CPC .............. *H05K 1/11* (2013.01); *G02F 1/1343* (2013.01); *G02F 1/13452* (2013.01); *H05K 3/108* (2013.01); *H05K 3/22* (2013.01)

(58) Field of Classification Search
CPC ............ H05K 1/11; H05K 3/108; H05K 3/22; G02F 1/13452; G02F 1/1343
See application file for complete search history.

(56) References Cited

U.S. PATENT DOCUMENTS 6,317,248 B1 * 11/2001 Agrawal ................. G02F 1/155
                                                    340/438
6,492,599 B1 * 12/2002 Sugihara ............ G01R 1/07314
                                                    174/255

(Continued)

FOREIGN PATENT DOCUMENTS

EP            2328015           6/2011

OTHER PUBLICATIONS

Bau, et al., "TeslaTouch: Electrovibration for Touch Surfaces," UIST'10, Oct. 3-6, 2010, New York, New York USA, 10 pages.

(Continued)

*Primary Examiner* — Hoa C Nguyen
(74) *Attorney, Agent, or Firm* — Brownstein Hyatt Farber Schreck, LLP

(57) ABSTRACT

An electronic device can include a substrate and a conductive layer. The conductive layer can be disposed over at least a portion of the substrate and a patterned conductive material can be disposed over at least a portion of the conductive layer. Alternatively, the patterned conductive layer can be disposed over at least a portion of a surface of the substrate and the conductive layer can be disposed over a portion of the surface of the substrate and in between the patterned conductive material. The conductive layer can be disposed over at least a portion of the patterned conductive material. The patterned conductive material can have a resistivity that is lower than a resistivity of the conductive layer.

17 Claims, 14 Drawing Sheets

(56) References Cited

U.S. PATENT DOCUMENTS

| | | |
|---|---|---|
| 6,690,032 B1 | 2/2004 | Umetsu |
| 6,774,971 B2 | 8/2004 | Shirato et al. |
| 7,211,885 B2 | 5/2007 | Nordal et |
| 7,543,376 B2 | 6/2009 | Yoshino et al. |
| 7,898,719 B2 * | 3/2011 | Schofield ................ B60R 1/088 359/267 |
| 8,547,350 B2 | 10/2013 | Anglin et al. |
| 2004/0183484 A1 * | 9/2004 | Ide ...................... G02F 1/13452 315/366 |
| 2011/0102719 A1 | 5/2011 | Kakehi et al. |
| 2011/0186336 A1 | 8/2011 | Nakayama |
| 2012/0038577 A1 | 2/2012 | Brown et al. |

OTHER PUBLICATIONS

Feist, "Samsung snags patent for new pressure sensitive touch-screens," posted on AndroidAuthority.com at URL: http://www.androidauthority.com/samsung-patent-pressure-sensitive-touch-screens-354860, Mar. 7, 2014, 1 page.

* cited by examiner

"PRIOR ART"

LOWERING THE SHEET RESISTANCE OF A CONDUCTIVE LAYER

TECHNICAL FIELD

The present invention relates generally to electronic devices, and more specifically to electrical connections in electronic devices.

BACKGROUND

Electronic devices, such as smartphones and computers, include devices formed with one or more substrates or layers. For example, a display in a smartphone can include a display stack formed with multiple layers. The layers can include a cover glass, a polarizer, a conductive layer, a color filter, and a display layer. Conductive contacts, such as, for example, contact pads can be used to transmit electrical signals to and from various components on a layer or to a layer itself.

FIG. 1 illustrates an electrical connection between conductive contacts on two substrates. A conductive contact 100 is disposed over the front surface of a substrate 102 and another conductive contact 104 is disposed over a back surface of another substrate 106, although in some situations the contacts may be disposed over the front and back of the same substrate. A flexible cable 108 is used to form an electrical connection between the conductive contacts 100, 104. The flexible cable has a bend radius that limits how sharp the bend in the flexible cable 108 can be between the two conductive contacts 100, 104. Due at least in part to its bend radius, the flexible cable can consume considerable area in an electronic device. The amount of area consumed by the flexible cable can be an issue when the size of the electronic device is small.

Additionally, the bend in the flexible cable can produce cracks in one or more conductive traces included in the flexible cable. The cracks can be created when the flexible cable is first bent or the cracks can develop over time. Either way, the cracks in the conductive traces can prevent electrical signals from being transmitted through the entire length of the flexible cable, which can render the electronic device inoperable.

In some embodiments, a conductive layer can be electrically connected to one of the conductive contacts (e.g., 104) and a signal transmitted to the conductive layer using the conductive contact. The sheet resistance of the conductive layer, however, can cause the signal to be non-uniform across the surface of the conductive layer. This non-uniformity can adversely affect the performance of the electronic device. For example, if the conductive layer is connected to ground for electrostatic discharge (ESD) protection, the ESD protection may be ineffective due to the non-uniformity of the ground signal across the conductive layer.

SUMMARY

In one aspect, an electronic device can include a conductive layer disposed over at least a portion of a surface of a substrate. A patterned conductive material can be disposed over at least a portion of the conductive layer. The patterned conductive material can have a resistivity that is lower than a resistivity of the conductive layer.

In another aspect, an electronic device can include a patterned conductive material disposed over at least a portion of a surface of a substrate. A conductive layer can be disposed over at least a portion of the surface of the substrate and between the patterned conductive layer. The conductive layer may also be disposed over at least a portion of the patterned conductive material. The conductive layer can have a resistivity that is higher than a resistivity of the patterned conductive material.

In another aspect, an electronic device can include a conductive layer disposed over at least a portion of a surface of a substrate. A patterned conductive material can be disposed over at least a portion of the conductive layer. The patterned conductive material can have a resistivity that is lower than a resistivity of the conductive layer. A layer can be disposed over at least a portion of the conductive layer and at least a portion of the patterned conductive material. A conductive contact can be disposed over the surface of the substrate. A conductive material can electrically connect the conductive contact to the layer disposed over the conductive layer.

In another aspect, an electronic device can include a conductive layer disposed over at least a portion of a surface of a substrate. A patterned conductive material can be disposed over at least a portion of the conductive layer. The patterned conductive material can have a resistivity that is lower than a resistivity of the conductive layer. A layer can be disposed over at least a portion of the conductive layer and at least a portion of the patterned conductive material. An electrical connector can electrically connect the conductive layer to the layer disposed over the conductive layer.

In an additional aspect, a display stack may include a substrate, a first conductive contact positioned below the substrate and a first conductive layer positioned below the substrate. The first conductive layer may be electrically connected to the first conductive contact. The display stack may also include a second conductive contact positioned above the substrate, and a conductive material disposed over at least a portion of the first conductive contact and the second conductive contact.

In a further aspect, an electronic device may include a substrate, a conductive layer disposed over at least a portion of the substrate, and a patterned conductive material. The patterned conductive material may be disposed over one of: at least a portion of the conductive layer, or at least a portion of the substrate. Where the patterned conductive material is disposed over a portion of the substrate, the conductive layer is disposed over the patterned conductive material. The electronic device may also include a first conductive contact positioned below the substrate, a second conductive contact positioned above the substrate, and a conductive material disposed over at least a portion of the first conductive contact and the second conductive contact.

In another aspect, a method for forming an electrical connection in an electronic device may include determining if at least one mask is applied to at least one of: at least a portion of a substrate, or at least one layer of an electrical connection. The method may also include determining if an insulating material is initially applied to at least one of: at least the portion of the substrate, or at least one layer of the electrical connection. In the method, in response to determining the insulating material is applied, an insulating material may be formed over at least one of: at least the portion of the substrate, or at least one layer of the electrical connection. Alternatively, in response to determining the insulating material is not applied, at least one distinct layer of the electrical connection may be formed. The method of additionally include determining if the insulating material is subsequently applied to at least one of: at least the portion of the substrate, or the at least one distinct layer of the electrical connection.

BRIEF DESCRIPTION OF THE DRAWINGS

Embodiments are better understood with reference to the following drawings. The elements of the drawings are not necessarily to scale relative to each other. Identical reference numerals have been used, where possible, to designate identical features that are common to the figures.

DETAILED DESCRIPTION

Figure 1:
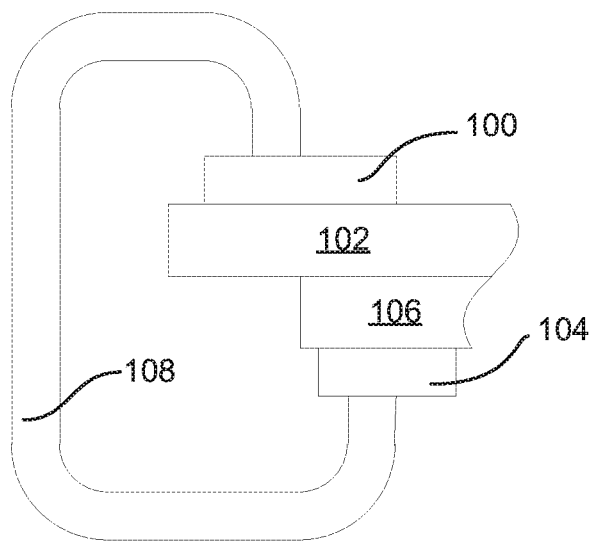
FIG. 1 illustrates an electrical connection between conductive contacts on two substrates in accordance with the prior art.

Embodiments described herein may provide an electrical connection between conductive contacts disposed over two different surfaces of a single substrate or on two or more substrates. As one example, first and second conductive contacts may be located on opposite sides of a substrate and connected to one another, in full or in part, by a conductive material. A conductive material may be disposed over at least portions of the conductive contacts to electrically connect the conductive contacts. In some embodiments, the conductive material also overlies, contacts, or is otherwise adjacent to an intervening edge of the substrate between the two contacts. The conductive material may be formed from metal, a conductive polymer, a mesh or nanowire, a ceramic, an impregnated resin and the like. The conductive contacts can be used to transmit a signal or signals to components disposed over or in a substrate, to conductive layers disposed over different surfaces of a single substrate, or to conductive layers disposed over two or more substrates.

In another embodiment, a signal can be transmitted over the conductive layer using patterned conductive material disposed over the substrate and/or over the conductive layer. The patterned conductive material can be used to lower the sheet resistance of the conductive layer to improve signal transmission across the surface of a conductive layer. Additionally or alternatively, the patterned conductive material can be used to protect a touch-sensing circuit, element, or array of elements from noise generated by an electronic device that incorporates the touch-sensing technology. The patterned conductive material can act as a ground plane, shielding a touch-sensing circuit, element, or array of elements from parasitic capacitances that may arise when a metal housing of an electronic device incorporating the touch-sensing element(s) deforms.

In another embodiment, a layer can be connected to a reference voltage or signal to prevent or reduce noise or other signal processing issues. For example, a back polarizer in a display stack can be connected to a reference level, such as ground, and used, in part, to protect the display stack or electronic device from electrostatic discharge (ESD). Embodiments described herein provide various method and structures for connecting the layer to the reference voltage.

Directional terminology, such as "top", "bottom", "front", "back", "leading", "trailing", etc., is used with reference to the orientation of the Figure(s) being described. Because components of embodiments described herein can be positioned in a number of different orientations, the directional terminology is used for purposes of illustration only and is in no way limiting. When used in conjunction with a substrate, a layer, substrates, or layers in an electrical device, such as the layers in a display stack included in an electronic device, the directional terminology is intended to be construed broadly, and therefore should not be interpreted to preclude the presence of one or more intervening layers or other intervening device features or elements. Thus, a given substrate or layer that is described herein as being formed on, formed over, disposed over, or disposed over another layer may be separated from the latter layer by one or more additional layers.

Further, the term "electronic device" is to be understood as any type of electronic device, including, but not limited to, a cellular telephone or smart telephone, a tablet computer, a computing device, an integrated circuit, and a printed circuit board or boards.

Figure 2A:
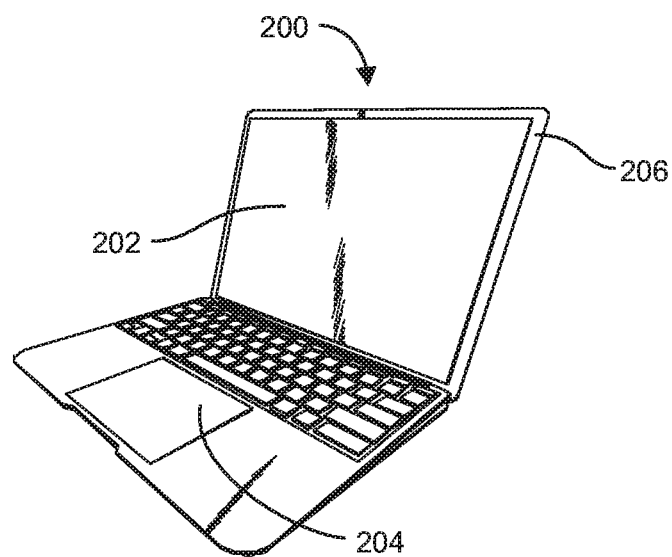
FIGS. 2A-2C depict perspective views of examples of electronic devices in an embodiment.
Figure 2B:
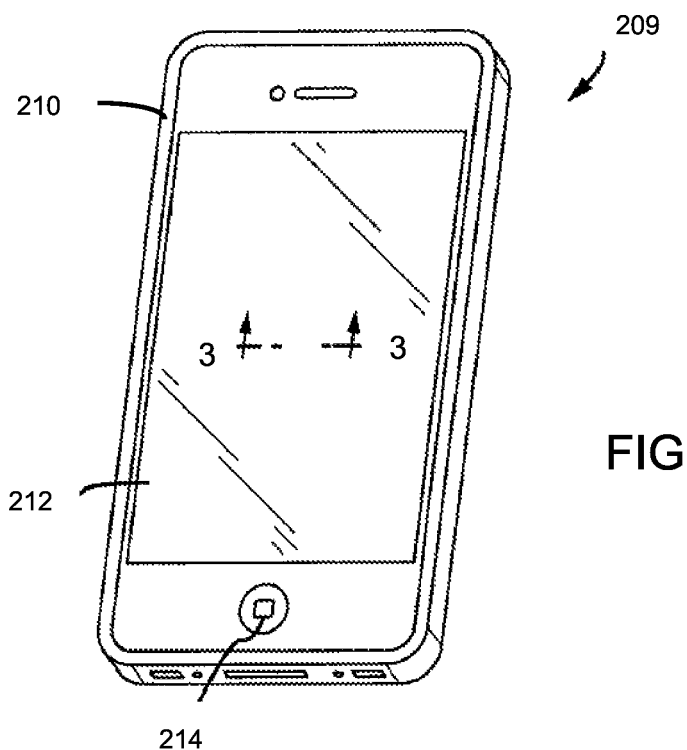
Figure 2C:
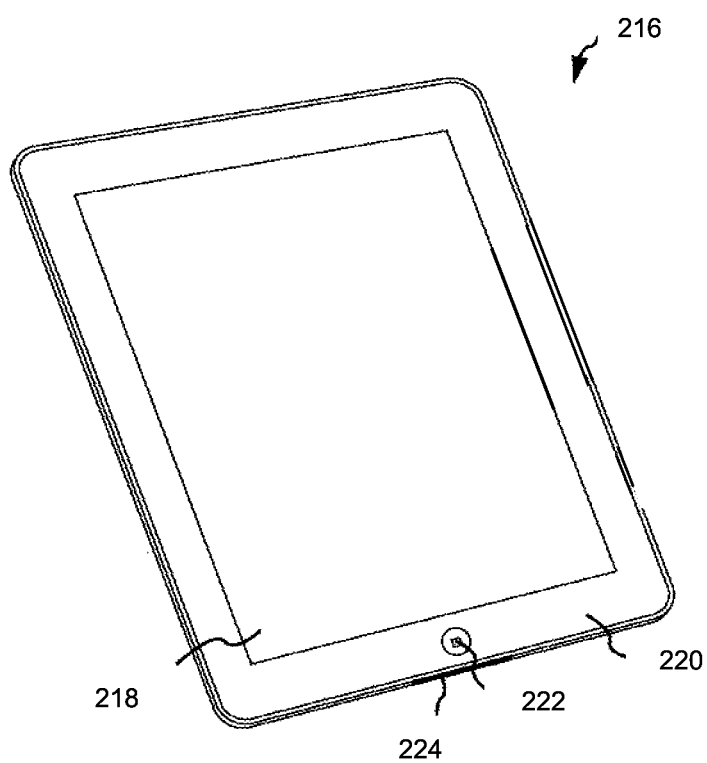

Referring now to FIGS. 2A-2C, there are shown front perspective views of examples of electronic devices. As shown in FIG. 2A, the electronic device 200 can be a laptop or netbook computer that includes a display 202 and a touch device 204, shown in the illustrated embodiment as a trackpad. An enclosure 206 can form an outer surface or partial outer surface and protective case for the internal components of the electronic device 200, and may at least partially surround the display 202 and the trackpad 204. The enclosure 206 can be formed of one or more components operably connected together, such as a front piece and a back piece.

The display 202 is configured to display a visual output for the electronic device 200. The display can be implemented with any suitable display, including, but not limited to, a liquid crystal display (LCD), an organic light-emitting display (OLED), or organic electro-luminescence (OEL) display.

The trackpad 204 can be used to interact with one or more viewable objects on the display 202. For example, the trackpad 204 can be used to move a cursor or to select a file or program (e.g., represented by an icon) shown on the display. The trackpad 204 can use capacitive sensing to detect an object, such as a finger or a conductive stylus, near or on the surface of the trackpad 204. The trackpad 204 can include a capacitive sensing system that detects touch through capacitive changes at capacitive sensors. Additionally or alternatively, the same or another capacitive sensing system can be used to detect an amount of force applied to the trackpad using capacitive changes.

FIG. 2B is a front perspective view of another electronic device, a smart telephone 209 that includes an enclosure 210 surrounding a display 212 and one or more buttons 214 or input devices. The enclosure 210 can be similar to the enclosure described in conjunction with FIG. 2A, but may vary in form factor and function.

The display 212 can be implemented with any suitable display, including, but not limited to, a multi-touch capacitive sensing touchscreen (i.e., a touch device) that uses liquid crystal display (LCD) technology, organic light-emitting display (OLED) technology, or organic electro luminescence (OEL) technology. A capacitive sensing touchscreen device can detect a touch or force using capacitive changes at capacitive sensors.

The button 214 can take the form of a home button, which may be a mechanical button, a soft button (e.g., a button that does not physically move but still accepts inputs), an icon or image on a display, and so on. Further, in some embodiments, the button 214 can be integrated as part of a cover glass of the electronic device.

Referring now to FIG. 2C, there is shown a front perspective view of another electronic device. In the illustrated embodiment, the electronic device 216 is a tablet computer that can include a display 218, an enclosure 220, and one or more buttons 222 or input devices. The enclosure, display, and the one or more buttons 222 can be similar to the enclosure, display, and button described in conjunction with FIG. 2B, but may vary in form factor and function.

The electronic device 216 can also include one or more receiving ports 224. A receiving port 224 can receive one or more plugs or connectors, including, but not limited to, a universal serial bus cable, a tip ring sleeve connector, or the like.

Figure 3:
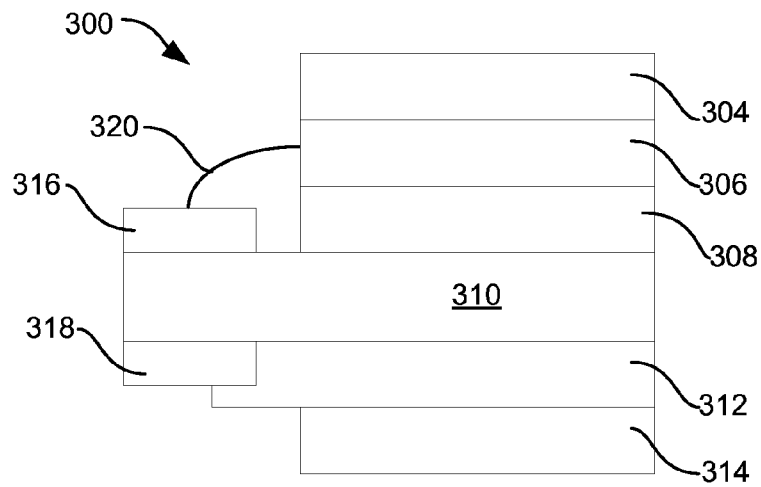
FIG. 3 illustrates a simplified, schematic cross-section view of the display taken along line 3-3 in FIG. 2B in an embodiment.

FIG. 3 illustrates a cross-section view of the display taken along line 3-3 in FIG. 2B in an embodiment. The layers of the display stack 300 can include the layers that constitute the display 202. For example, a top layer in the display stack 300 can be a cover glass (not shown) that is disposed over a front polarizer 304. The front polarizer 304 is disposed over a front transparent conductive layer 306, such as, for example, an ITO layer. The front transparent conductive layer 306 may, for example, provide electrostatic protection to prevent electrical discharge into the display.

The front transparent conductive layer 306 is disposed over a color filter layer 308 that is disposed over a display layer 310. The display layer 310 may take a variety of forms, including a LCD, an LED display, and an OLED display. In many embodiments, the display layer may be formed from glass or have a glass substrate.

A back transparent conductive layer 312 is below the display layer 310. The back transparent conductive layer 312 is disposed over a back polarizer 314. The back transparent conductive layer 312 may serve to prevent noise from entering the system through the display stack and thus may function as an isolation plane. In alternative embodiments, one or both of the conductive layers may have other functions and/or other layers, elements, and the like may be part of the display stack 300.

Since certain layers, elements or the like located on one or both sides of the display layer 310 may require an electrical signal (or the same electrical signal), it may be useful to place electrical contacts in close proximity to one another but on opposing sides of a substrate. In order to do so, front and back conductive contacts 316, 318 may be provided.

A front conductive contact 316 is disposed over a front surface of the display layer 310 and a back conductive contact 318 is disposed over an opposing back surface of the display layer 310. The conductive contacts 316, 318 can be implemented with any suitable conductive material and formation, including, but not limited to, contact pads, flexible cable connectors, and conductive traces.

An electrical connector 320 may electrically connect the front transparent conductive layer 306 to the front conductive contact 316. The back transparent conductive layer 312 may be electrically connected to the back conductive contact 318 in the illustrated embodiment using any given type of electrical connection. For example, the conductive layer 312 may be disposed over a portion of the back conductive contact 318 or an electrical connector (not shown) similar to the electrical connector 320 can connect the back transparent conductive layer to the back conductive contact.

Embodiments described herein may provide structures and methods for electrically connecting the back conductive contact 318 to the front conductive contact 316, thereby allowing a signal or signals to be transmitted to or from the back conductive contact 318 using the front conductive contact 316. In the illustrated embodiment, a signal or signals transmitted to the front conductive contact 316 can be transmitted to the front and back transparent conductive layers 306, 312 because the front conductive layer 306 is electrically connected to the front conductive contact 316 using electrical connector 320 and the back conductive contact 318 is electrically connected to the front conductive contact 316 using the techniques and methods described in more detail herein. It should be appreciated that the front and back conductive contacts 316, 318 may likewise provide electrical connections to additional layers or elements of the electronic device, or may provide such connections instead of providing connections to either of the conductive layers 306, 312.

Those skilled in the art will recognize that other components or devices can be disposed over the display layer 310. By way of example only, one or more integrated circuits (not shown) can be disposed over the display layer 310. In some embodiments, the other components, including the conductive contacts, can be disposed in an area on the display layer 310 that extends into a region that is not visible by a user viewing the display of the electronic device. For example, when the electronic device is a smartphone or a tablet computing device, the other components and the conductive contacts are disposed over the display layer in an area that is covered by a black mask.

The front and back polarizers 304, 314 can be implemented in any suitable form and can include polarizers that are known and used in the art. Additionally, the color filter layer 308 can be implemented in any suitable form and can include a color filter layer that is known and used in the art.

Figure 4:
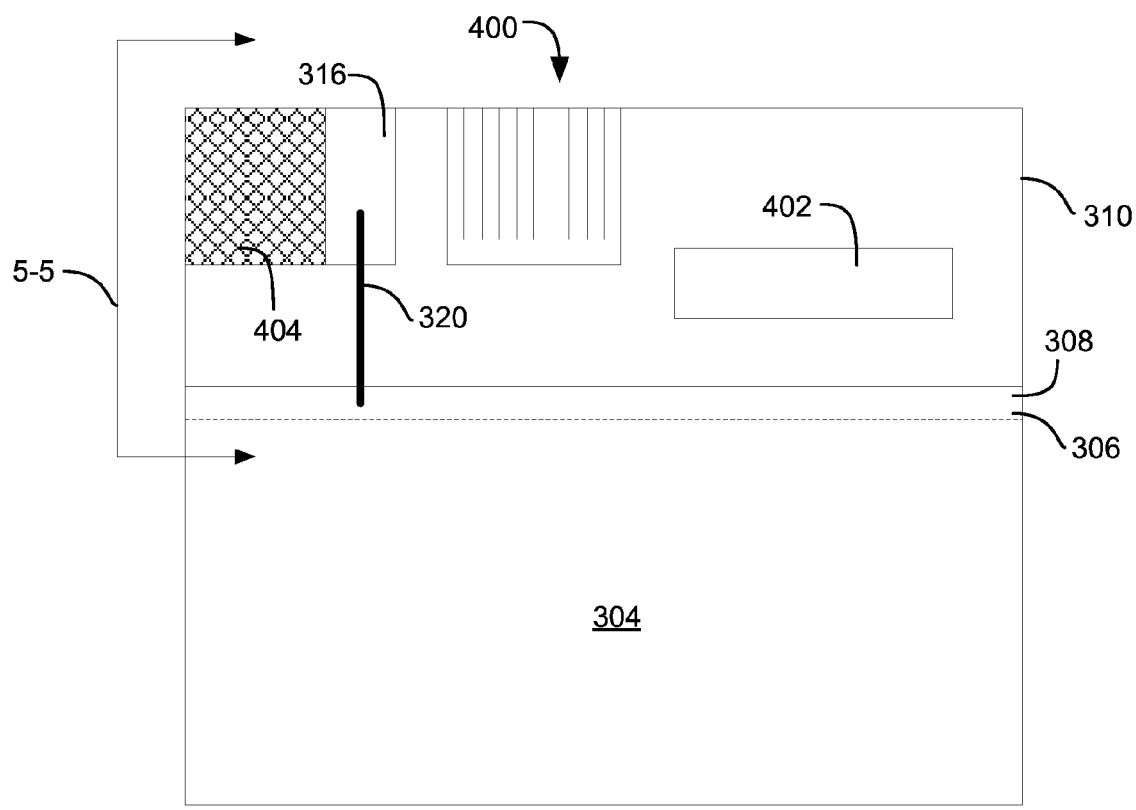
FIG. 4 depicts a top view of the display layer shown in FIG. 3 and one example of an electrical connection to the electrical contact in an embodiment.

Referring now to FIG. 4, there is shown a top view of the display layer 310 shown in FIG. 3 and one example of an electrical connection to the front conductive contact 316 in an embodiment. Display layer 310 includes the front conductive contact 316, a flexible cable connector 400, and one or more integrated circuits 402. A conductive material 404 is disposed over at least a portion of the front conductive contact 316. The conductive material 404 can be implemented with any suitable conductive material or combination of materials, including, but not limited to, metal, silver nanowire, and conductive nanoparticles.

Figure 5:
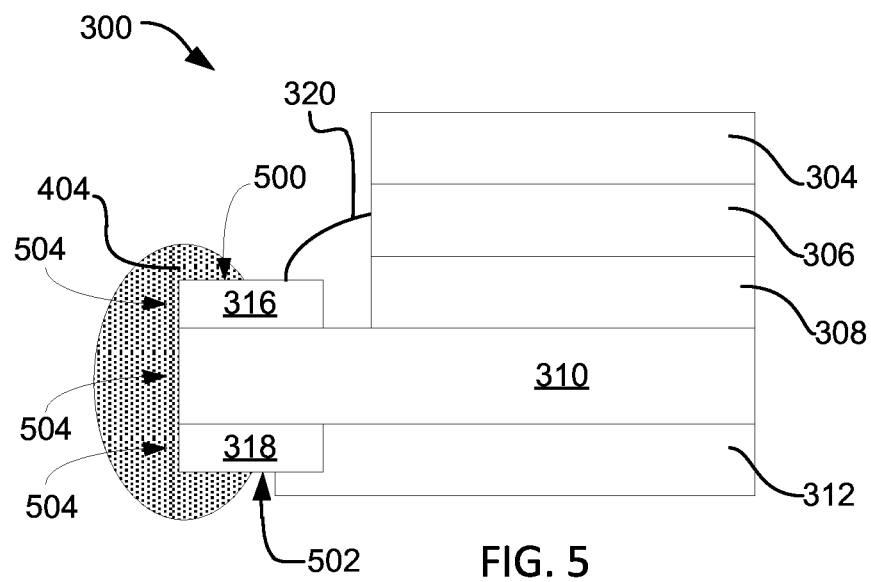
FIG. 5 illustrates a cross-section view of the substrate and electrical connection taken along line 5-5 in FIG. 4.

FIG. 5 illustrates a cross-section view of the display layer 310 and the electrical connection taken along line 5-5 in FIG. 4. The front polarizer 304 and the back polarizer 314 are not shown for simplicity. The conductive material 404 is disposed over at least a portion of the front surface 500 of the front conductive contact 316 and the back surface 502 of the back conductive contact 318. The conductive material 404 can also be disposed over the surfaces 504 between the front and back surfaces 500, 502 of the front and back conductive contacts 316, 318.

Figure 6:
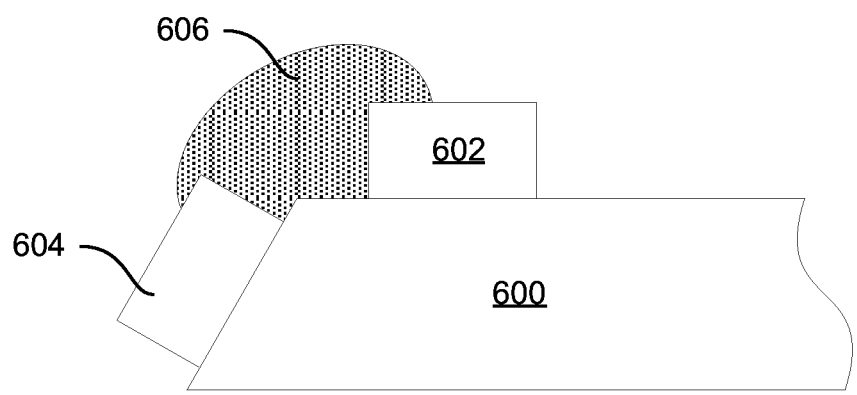
FIG. 6 depicts an example of a substrate with conductive contacts on different surfaces in an embodiment.

The surfaces of the conductive contacts in which the conductive material is disposed over are called contact surfaces. When the conductive material 404 is disposed over the front surface 500 of the front conductive contact 316 and the back surface 502 of the back conductive contact 318, an electrical connection is formed. Some of the contact surfaces (i.e., 500, 502) are oriented in opposite directions and the other contact surfaces are oriented in the same direction. In other embodiments, all or some of the contact surfaces can be oriented in the same directions or in different (opposite and non-opposite) directions. FIG. 6 depicts an example of a substrate 600 with two conductive contacts 602, 604 on different surfaces. The conductive material 606 is disposed over multiple contact surfaces with all of the contact surfaces of the conductive contacts oriented in different directions.

Returning to FIG. 5, since the back transparent conductive layer 312 is electrically connected to the back conductive contact 318, the back transparent conductive layer 312 is also electrically connected to the front conductive contact 316 through the conductive material 404. A signal can be transmitted to or from the back transparent conductive layer 312 using the front conductive contact 316, the conductive material 404, and the back conductive contact 318. For example, an unused existing electrical connection to front conductive contact 316 can be used to transmit a signal to the back transparent conductive layer 312 using conductive material 404 and back conductive contact 318. Alternatively, a new electrical connection to the front conductive contact 316 can be added to the device and used to transmit a signal to or from the back transparent conductive layer 312 using conductive material 404 and back conductive contact 318.

The conductive material 404 can be configured or shaped into any desired shape or thickness. For example, the conductive material 404 can be formed at a thickness or a shape that results in the conductive material consuming less area in an electronic device compared to a conventional flexible cable connection (see e.g., 108 in FIG. 1). Flexible cables may come in different thicknesses and widths, but flexible cables are substantially fixed in a shape and limited in part by a bend radius when connected to the conductive contacts.

Although the embodiment described in conjunction with FIGS. 3-6 describes a display layer and a back transparent conductive layer, other embodiments are not limited to this construction. Any type of substrate, such as glass, plastic, printed circuit board, or flexible cable, can be used in place of the display layer and the back transparent conductive layer. Various embodiments can include an electrical connection between two conductive contacts on a single substrate or an electrical connection between two conductive contacts on different substrates. The contact surfaces of the conductive contacts can be oriented in different directions or in the same direction. The different directions can assume any difference in direction. By way of example only, the different directions can be opposite (180 degrees), at an acute angle with respect to each other, or at an obtuse or reflex angle with respect to each other.

Figure 7:
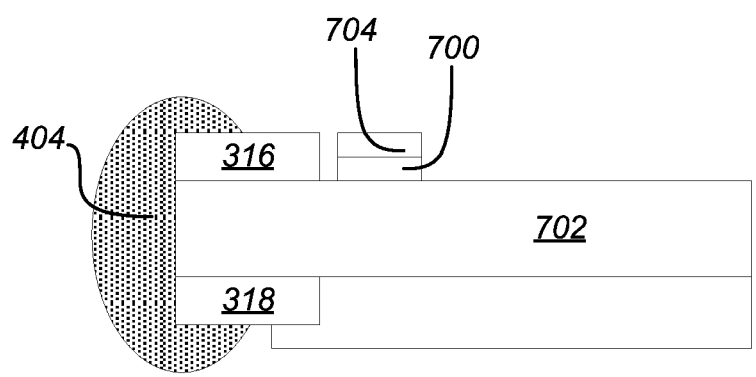
FIG. 7 illustrates a cross-section view of another example of electrical connections in an embodiment.
Figure 8:
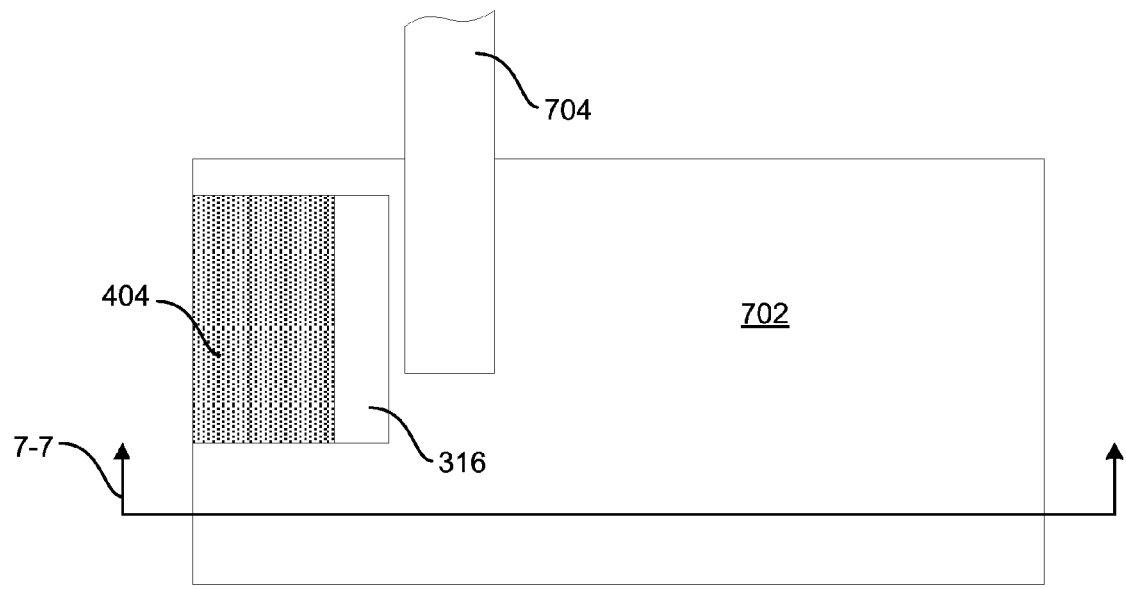
FIG. 8 depicts a top view of the electrical connections shown in FIG. 7 in an embodiment.

Referring now to FIG. 7, there is shown a cross-section view of another example of electrical connections in an embodiment. FIG. 8 depicts a top view of the electrical connections shown in FIG. 7. The conductive material 404 is disposed over at least a portion of the front conductive contact 316 and the back conductive contact 318 and, optionally, the surfaces between the conductive contacts. A first flexible cable connector 700 (FIG. 7) is disposed over the front surface of a substrate 702 and a second flexible cable 704 is connected to the first cable connector 700. The substrate 702 can be made of any suitable material or combination of materials including, but not limited to, glass, plastic, and flexible cable. The flexible cable 704 can be implemented with any suitable flexible cable, including, but not limited to, ribbon cable, flexible flat cable, flat panel cable, and flexible printed circuit. In other embodiments, the flexible cable 704 can be connected to the front conductive contact 316.

Figure 9:
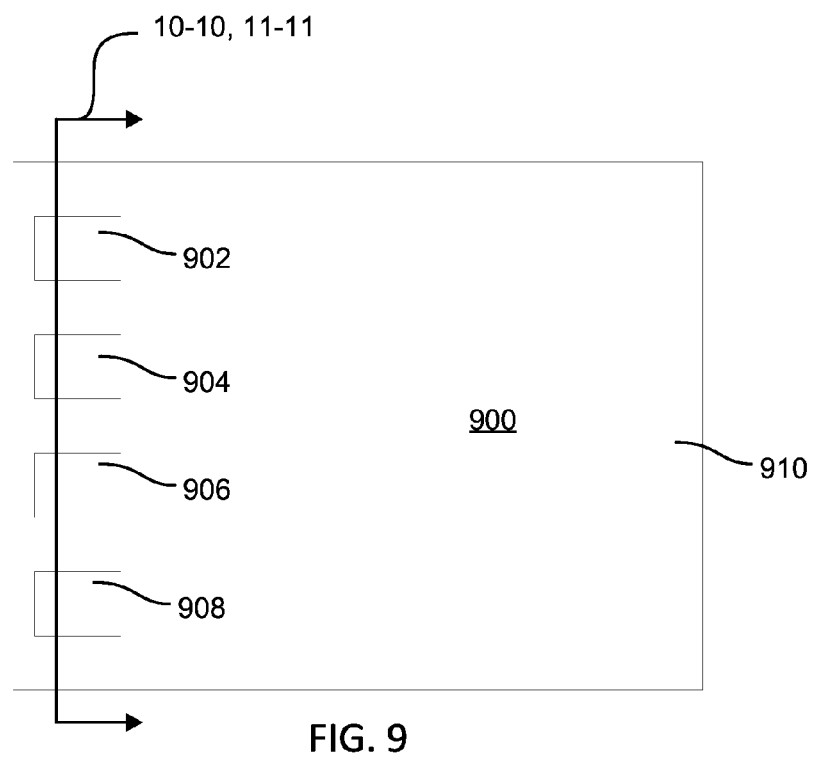
FIG. 9 illustrates a top view of an example of conductive contacts on a substrate in an embodiment.

Referring now to FIG. 9, there is shown a top view of an example of conductive contacts on a substrate in an embodiment. The substrate 900 can be made of any suitable material or combination of materials including, but not limited to, glass, plastic, and flexible cable. Conductive contacts 902, 904, 906, 908 are disposed over the front surface 910 of the substrate 900.

Figure 10:
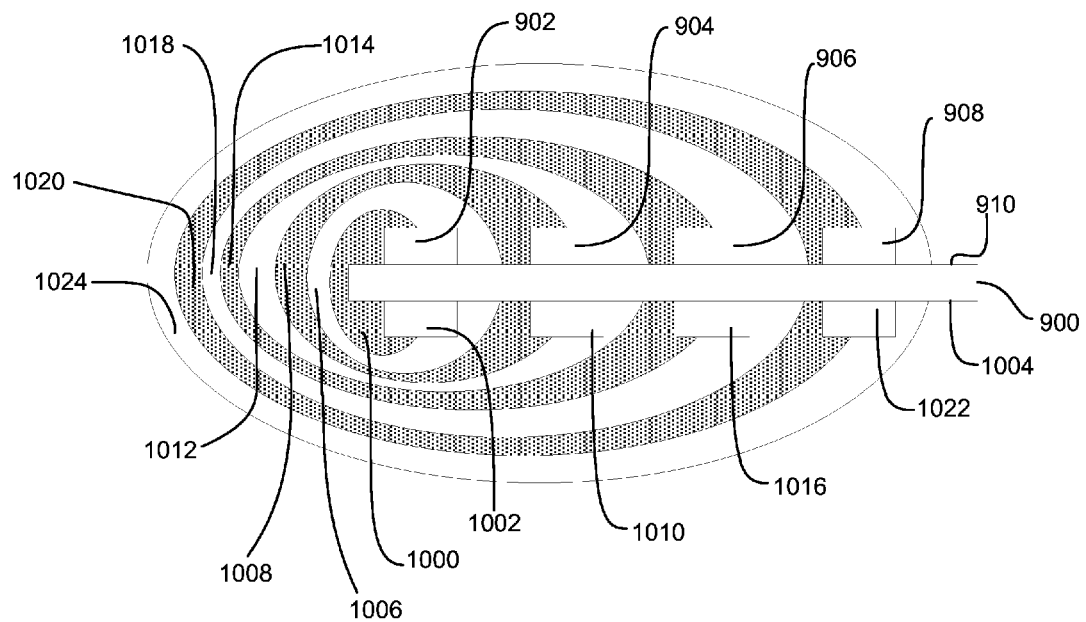
FIG. 10 depicts a cross-section view of an example of electrical connections taken along line 10-10 in FIG. 9 in an embodiment.

FIG. 10 depicts a cross-section view of an example of electrical connections along line 10-10 for the embodiment shown in FIG. 9. Conductive material 1000 electrically connects the conductive contact 902 on the front surface 910 of the substrate 900 to a conductive contact 1002 on a back surface 1004 of the substrate 900. Insulating material 1006 surrounds the conductive material 1000 to electrically isolate the electrical connection between the front and back conductive contacts 902, 1002.

Conductive material 1008 electrically connects the conductive contact 904 on the front surface 910 of the substrate 900 to a conductive contact 1010 on the back surface 1004 of the substrate 900. Insulating material 1012 surrounds the conductive material 1008 to electrically isolate the electrical connection between the front and back conductive contacts 904, 1010.

Conductive material 1014 electrically connects the conductive contact 906 on the front surface 910 of the substrate 900 to a conductive contact 1016 on the back surface 1004 of the substrate 900. Insulating material 1018 surrounds the conductive material 1014 to electrically isolate the electrical connection between the front and back conductive contacts 906, 1016.

Conductive material 1020 electrically connects the conductive contact 908 on the front surface 910 of the substrate 900 to a conductive contact 1022 on the back surface 1004 of the substrate 900. Insulating material 1024 surrounds the conductive material 1020 to electrically isolate the electrical connection between the front and back conductive contacts 908, 1022. Outer insulating material 1024 is optional and is not included in some embodiments. For example, a device can omit the outer insulating material 1024 when the electrical connection between front and back conductive contacts 908, 1022 is connected to ground for electrostatic discharge (ESD) protection.

In the illustrated embodiment, the conductive material 1000, 1008, 1014, 1020 extends partially over the conductive contacts. In other embodiments, the conductive material can extend completely over the conductive contacts. Additionally, a different conductive material can be used to form each electrical connection or one or more electrical connections. For example, the conductive material 1014 can by of a different type than the other conductive materials 1000, 1008, and 1020. A different insulating material can also be used to isolate one or more electrical connections.

The electrical connections formed in the embodiment shown in FIG. 10 can also be appropriate when only one contact is near an edge of the substrate and the other conductive contacts are positioned closer and closer to the middle of the substrate 900. By way of example only, conductive contact 1002 (or conductive contacts 902, 1002) can be near an edge of the substrate 900 and the other conductive contacts 1010, 1016, 1022 (or 904, 906, 908) can be positioned closer and closer to the middle of the substrate 900.

Figure 11:
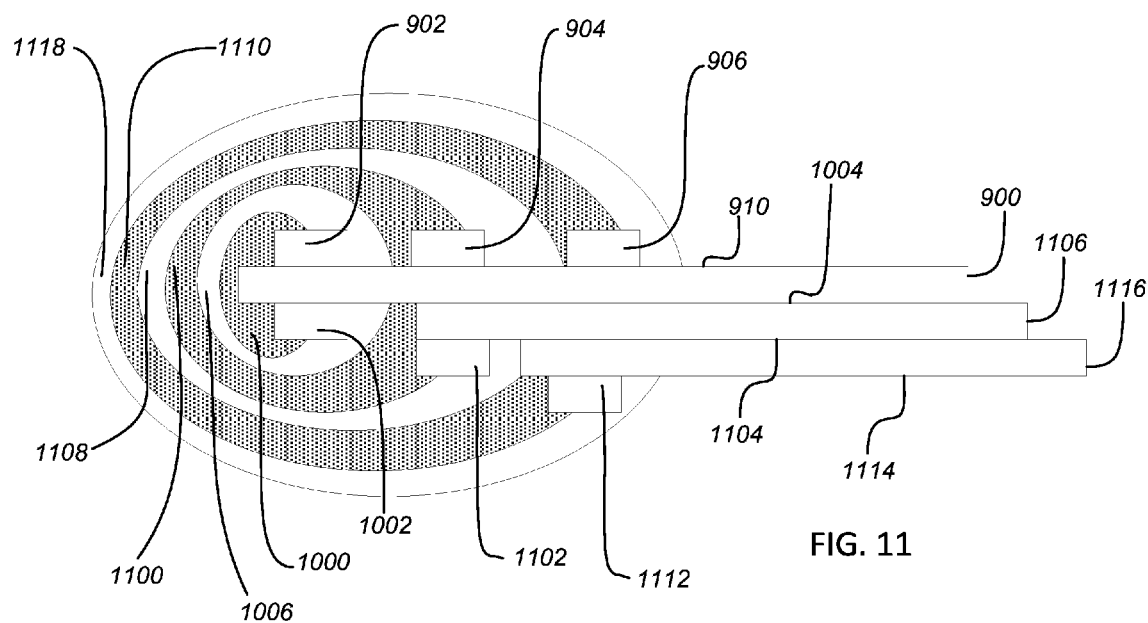
FIG. 11 illustrates a cross-section view of another example of electrical connections taken along line 11-11 in FIG. 9 in an embodiment.

FIG. 11 illustrates a cross-section view of another example of electrical connections along line 11-11 for the embodiment shown in FIG. 9. Only conductive contacts 902, 904, and 906 are shown in FIG. 11 for simplicity. Conductive material 1000 electrically connects the conductive contact 902 on the front surface 910 of the substrate 900 to the conductive contact 1002 on the back surface 1004 of the substrate 900. Insulating material 1006 surrounds the conductive material 1000 to electrically isolate the electrical connection between the front and back conductive contacts 902, 1002.

Conductive material 1100 electrically connects the conductive contact 904 on the front surface 910 of the substrate 900 to a conductive contact 1102 on a back surface 1104 of another substrate 1106. The substrate 1106 is disposed below the substrate 900. Insulating material 1108 surrounds the conductive material 1100 to electrically isolate the electrical connection between the front and back conductive contacts 904, 1102.

Conductive material 1110 electrically connects the conductive contact 906 on the front surface 910 of the substrate 900 to a conductive contact 1112 on a back surface 1114 of a substrate 1116. The substrate 1116 is disposed below the substrate 1106. Insulating material 1118 surrounds the conductive material 1110 to electrically isolate the electrical connection between the front and back conductive contacts 906, 1112.

The conductive contact 908 (not shown) can be electrically connected to a conductive contact on the back surface 1114 of the substrate 1116, or to a conductive contact on another substrate (not shown) that is disposed below the substrate 1116. The electrical connections formed in the embodiment shown in FIG. 11 can also be appropriate when one or more conductive contacts are positioned differently over a substrate. As discussed, the conductive contact 908 can be electrically connected to a conductive contact positioned closer to the middle of the substrate 1116 or to a conductive contact positioned near an edge on a separate substrate disposed below the substrate 1116.

Figure 12:
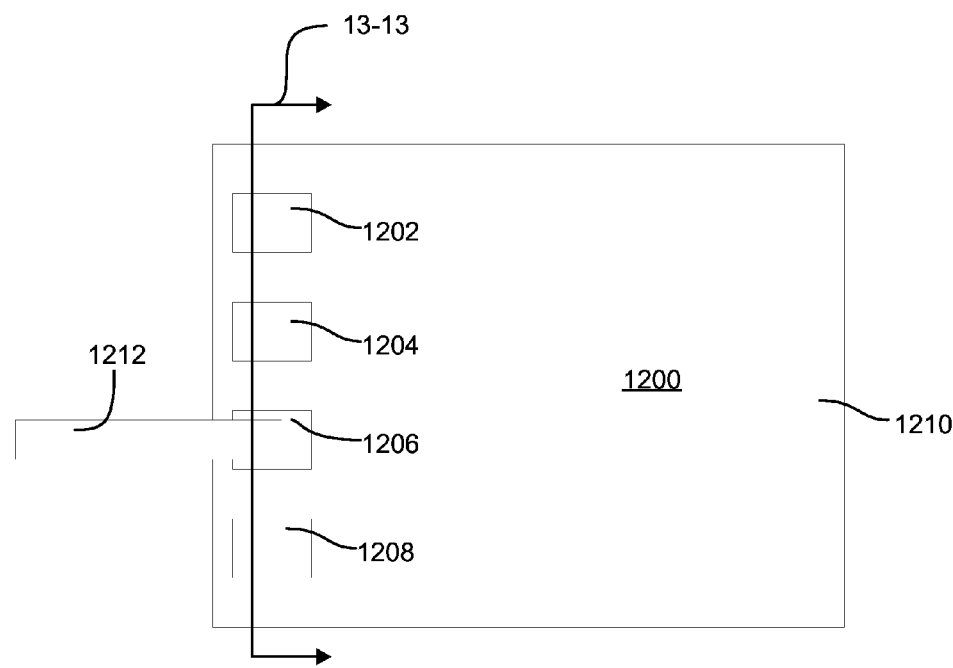
FIG. 12 depicts a top view of an example of conductive contacts on a substrate in an embodiment.

Referring now to FIG. 12, there is shown a top view of an example of conductive contacts on a substrate in an embodiment. The substrate 1200 can be made of any suitable material or combination of materials including, but not limited to, glass, plastic, and flexible cable. Conductive contacts 1202, 1204, 1206, 1208 are disposed over the front surface 1210 of the substrate 1200. A flexible cable 1212 is connected to the conductive contact 1206. The conductive contact 1206 can be implemented, for example, as a cable connector or a conductive contact pad.

Figure 13:
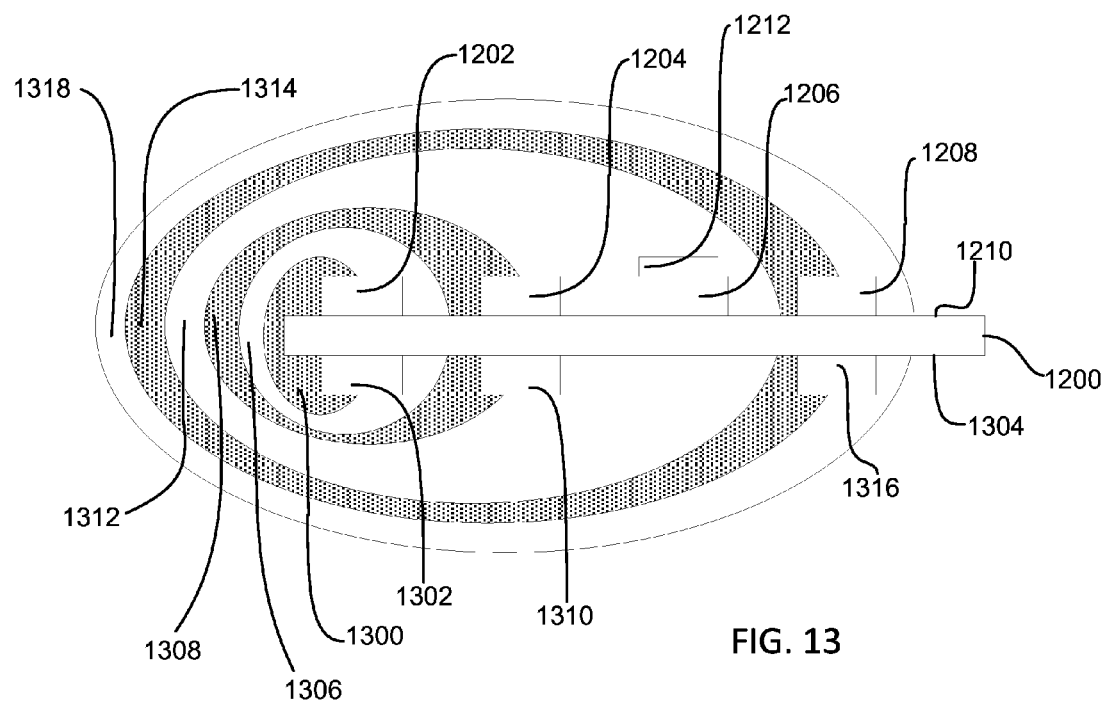
FIG. 13 illustrates a cross-section view of an example of electrical connections taken along line 13-13 in FIG. 12 in an embodiment.

FIG. 13 depicts a cross-section view of an example of electrical connections along line 13-13 for the embodiment shown in FIG. 12. Conductive material 1300 electrically connects the conductive contact 1202 on the front surface 1210 of the substrate 1200 to a conductive contact 1302 on a back surface 1304 of the substrate 1200. Insulating material 1306 surrounds the conductive material 1300 to electrically isolate the electrical connection between the front and back conductive contacts 1202, 1302.

Conductive material 1308 electrically connects the conductive contact 1204 on the front surface 1210 of the substrate 1200 to a conductive contact 1310 on the back surface 1304 of the substrate 1200. Insulating material 1312 surrounds the conductive material 1308 to electrically isolate the electrical connection between the front and back conductive contacts 1204, 1310. Insulating material 1312 also electrically isolates the electrical connection between the flexible cable 1212 and the conductive contact 1206.

Conductive material 1314 electrically connects the conductive contact 1208 on the front surface 1210 of the substrate 1200 to a conductive contact 1316 on the back surface 1304 of the substrate 1200. Insulating material 1318 surrounds the conductive material 1314 to electrically isolate the electrical connection between the front and back conductive contacts 1208, 1316. Outer insulating material 1318 is optional and is not included in some embodiments.

Figure 14:
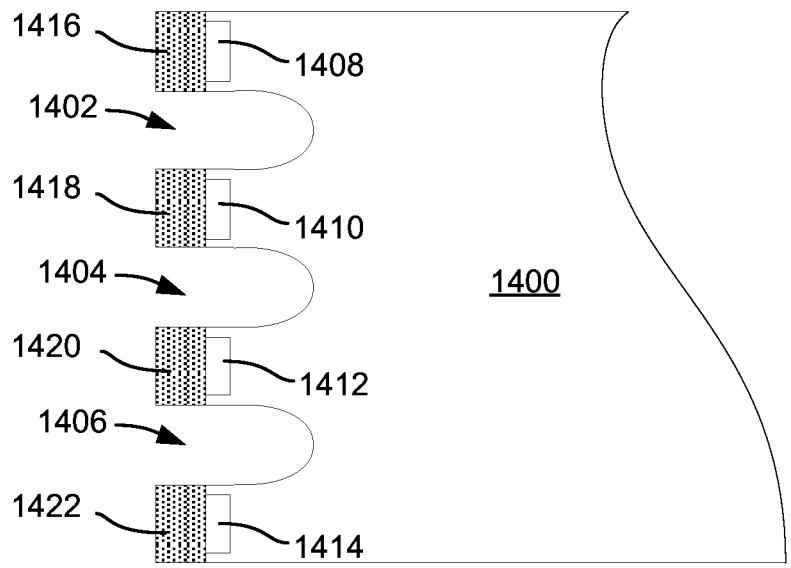
FIG. 14 depicts a top view of a substrate and electrical connections in an embodiment.

FIG. 14 illustrates a top view of a substrate and electrical connections in an embodiment. The substrate 1400 can be fabricated in any shape or design. In the illustrated embodiment, the substrate 1400 has trenches 1402, 1404, 1406. The trenches produce substrate fingers or protrusions, and conductive contacts 1408, 1410, 1412, 1414 are disposed over the substrate fingers. Conductive material 1416, 1418, 1420, 1422 is disposed over at least a portion of a respective conductive contact.

Those skilled in the art will recognize that a substrate can be fabricated in any given shape. Shaping the substrate can result in an easier fabrication process for the conductive contacts or electrical connections. By way of example only, if the substrate fingers are dipped in a conductive material, the substrate fingers can reduce the likelihood that conductive material will be formed on the non-finger portion of the substrate.

Additionally, shaping the substrate can allow for different conductive materials to be used to form one or more electrical connections. The conductive contacts 1408, 1410, 1412, 1414 can be electrically connected to conductive contacts on multiple substrates or on a single substrate.

In some embodiments, a conductive layer, such as, for example, the back transparent conductive layer 312 shown in FIGS. 3 and 5, can be implemented with a material, or combination of materials, that has a higher than desired impedance. For example, when the back transparent conductive layer 312 is formed with ITO, the impedance across the surface of the back transparent conductive layer 312 can be an issue when biasing the back transparent conductive layer 312. The resistance to the center of the layer 312 generally is higher than the resistance at an edge of the back transparent conductive layer 312, which can result in signal non-uniformity across the surface of the layer 312.

Figure 15:
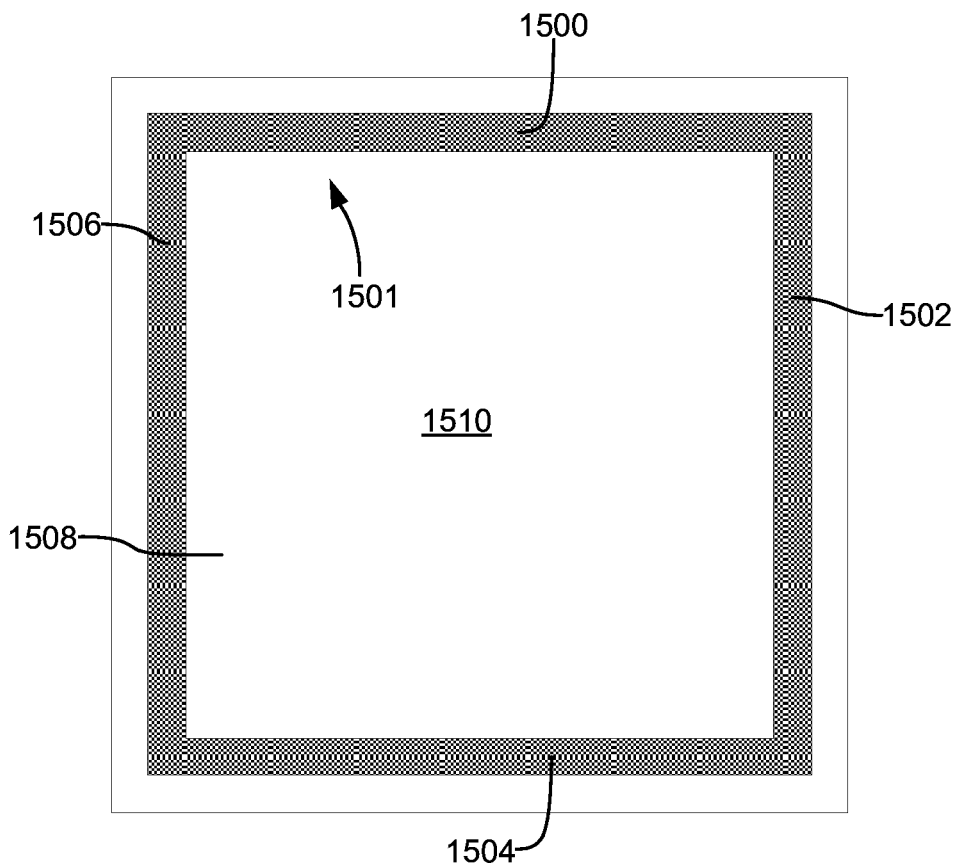
FIG. 15 illustrates one example of patterned conductive material over a conductive layer in an embodiment.

FIG. 15 depicts one example of patterned conductive material over a conductive layer in an embodiment. The patterned conductive material can be used to improve signal transmission across the surface of a conductive layer in certain embodiments. Additionally or alternatively, the patterned conductive material can be used to protect a touch-sensing circuit, element, or array of elements from noise generated by an electronic device that incorporates the touch-sensing technology. One example of a touch-sensing technology is capacitive sensing. The capacitive sensing can be used, for example, to detect one or more touches on a surface of an electronic device, or to detect a force or amount of force applied to a flexible surface in an electronic device.

The patterned conductive material can act as a ground plane, shielding a touch-sensing circuit, element, or array of elements from parasitic capacitances that may arise when a metal housing of an electronic device incorporating the touch-sensing element(s) deforms. The deformation may change a distance between the metal housing and the touch-sensing element(s), which, in turn, may create a parasitic capacitance at the element(s). The patterned conductive material can shield the touch-sensing technology from such parasitic capacitances.

Conductive material 1501 is patterned into conductive borders 1500, 1502, 1504, 1506 that are disposed over a surface 1508 of the conductive layer 1510. The conductive layer 1510 can be formed with any opaque or transparent conductive material or combination of materials. The patterned conductive material can be any type of opaque or transparent conductive material, including, but not limited to, a metal such as silver, or nanoparticles. The patterned conductive material can have a lower resistivity than the resistivity of the conductive layer, and the patterned conductive material may be used to lower the sheet resistance of the conductive layer.

The conductive borders 1500, 1502, 1504, 1506 are disposed around the perimeter edges of the conductive layer 1510 in the illustrated embodiment. Other embodiments can include only one conductive border or two or more conductive borders. A conductive border or borders can be formed prior to forming the conductive layer 1510. Alternatively, a conductive border or borders can be formed after the formation of the conductive layer 1510.

The conductive borders 1500, 1502, 1504, 1506 cooperate to form a conductive frame around the perimeter edges of the conductive layer 1510 in the illustrated embodiment. The conductive frame transmits a signal around the perimeter edges to improve signal uniformity across the surface of the conductive layer 1510. By way of example only, the conductive layer 1510 can be the back transparent conductive layer 312 shown in FIGS. 3 and 5. As described earlier, the patterned conductive material, depicted as conductive borders, can at least be used to lower the sheet resistance of the back transparent conductive layer 312.

Figure 16:
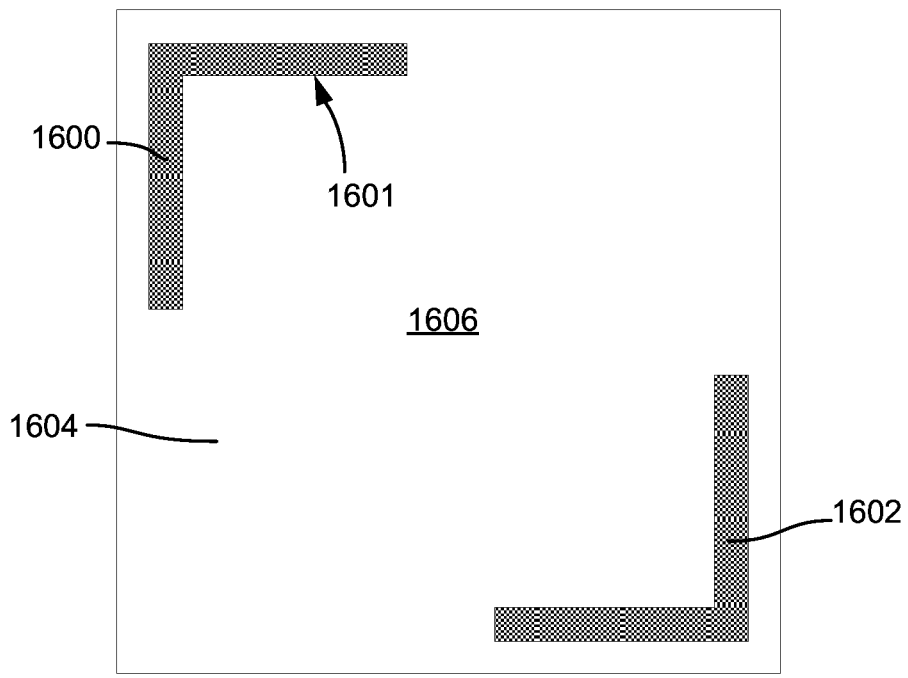
FIG. 16 depicts another example of patterned conductive material over a conductive layer in an embodiment.

Referring now to FIG. 16, there is shown another example of patterned conductive material over a conductive layer in an embodiment. The conductive material 1601 is patterned into corner sections 1600, 1602. The corner sections 1600, 1602 are disposed over a surface 1604 of the conductive layer 1606. Each corner section 1600, 1602 extends partially along two perimeter edges of the conductive layer 1606. The sides of the corner sections 1600, 1602 can have the same dimensions (length, width, and thickness), or one or more sides can have different dimension (length, width, and/or thickness) from another side. Additionally or alternatively, the corner sections 1600, 1602 can be made of the same material or combination of materials, or one corner section can be made of a different material(s) than the other corner section. Likewise, one or more sides can be made of a different material(s) than another side.

Figure 17:
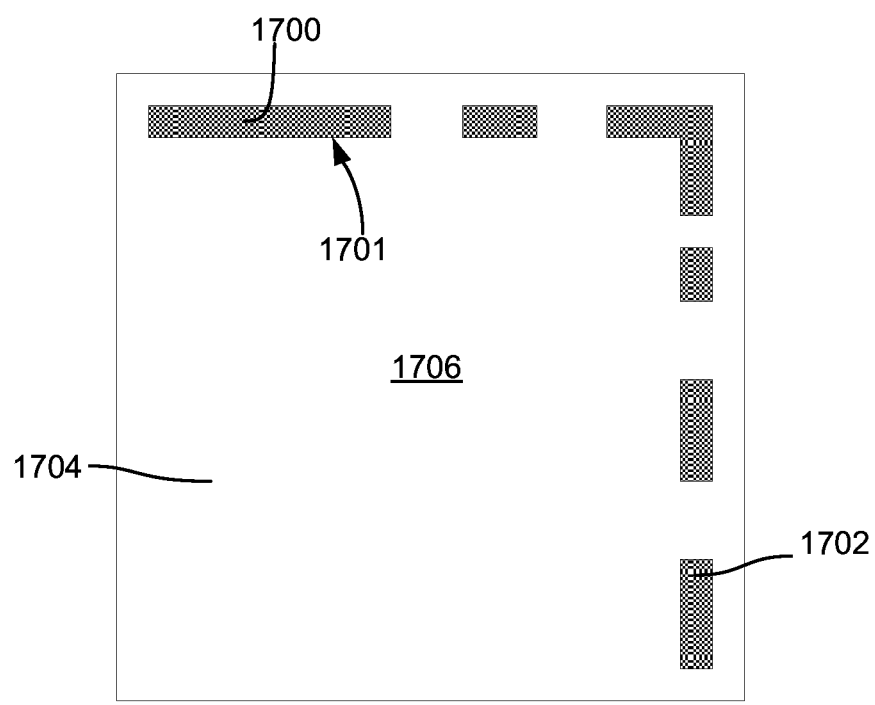
FIG. 17 illustrates another example of patterned conductive material over a conductive layer in an embodiment.

FIG. 17 illustrates another example of patterned conductive material over a conductive layer in an embodiment. Conductive material 1701 is patterned into conductive segments 1700, 1702. In the illustrated embodiment, some of the conductive segments 1700 have a first dimension while other conductive segments 1702 have a different second dimension. The conductive segments are fragmented in that each segment is not part of one continuous segment over the conductive layer 1706.

Embodiments can form the patterned conductive material at any location over a conductive layer. The patterned conductive material can be patterned into any given shape, width, length, or thickness. The shapes can be continuous or fragmented. When fragmented, each conductive segment can be made of the same conductive material(s) or one or more segments can be made of a different conductive material or materials.

The patterned conductive material can be formed over a layer using any suitable fabrication method. By way of example only, the patterned conductive material can be deposited over a surface of a layer. The patterned conductive material can be deposited using, for example, photolithography, screen printing, or inkjet printing. A mask can be used to mask off areas where the patterned conductive material is not to be formed. The patterned conductive material can be used with one or more electrical connections formed between two conductive contacts using a conductive material (e.g., see FIGS. 3, 5, 10, and 11).

Figure 18:
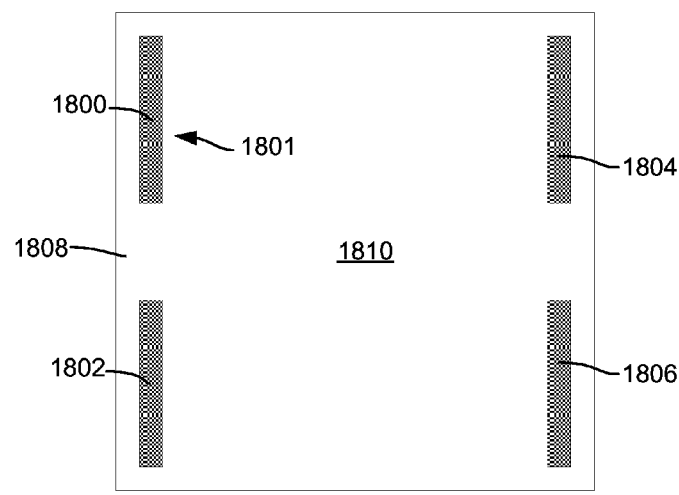
FIG. 18 depicts one example of a conductive layer with patterned conductive material in an embodiment.
Figure 19:
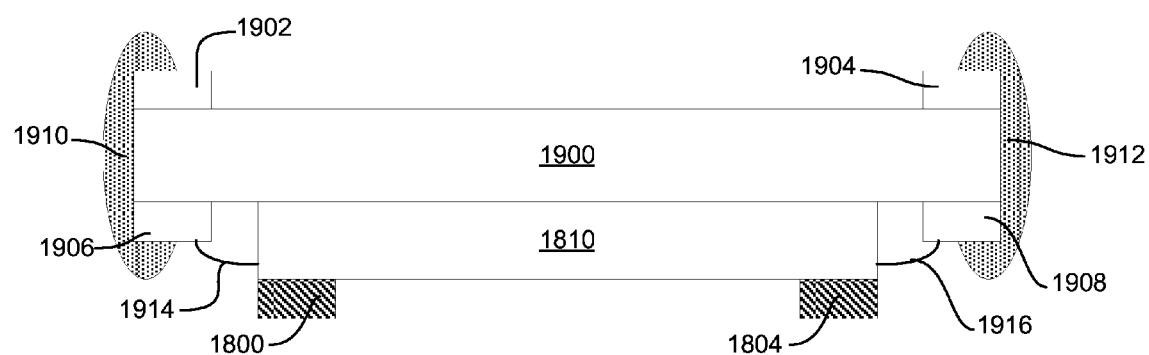
FIG. 19 illustrates a cross-section view of one example of electrical connections to the conductive layer of FIG. 18 in an embodiment.

Referring now to FIG. 18, there is shown one example of a conductive layer with patterned conductive material in an embodiment. Conductive material 1801 is patterned into conductive segments 1800, 1802, 1804, 1806. The segments are disposed over a surface 1808 of a conductive layer 1810. FIG. 19 illustrates a cross-section view of one example of electrical connections to the conductive layer 1810 in an embodiment. A substrate 1900 is disposed over the conductive layer 1810. The substrate 1900 can be any suitable type of substrate, including, but not limited to, glass. Two conductive contacts 1902, 1904 are disposed over a first surface of the substrate 1900 and two conductive contacts 1906, 1908 are disposed over a second surface of the substrate 1900. In the illustrated embodiment, the second surface of the substrate opposes the first surface of the substrate.

Conductive material 1910 electrically connects the conductive contact 1902 to the conductive contact 1906. Likewise, conductive material 1912 electrically connects the conductive contact 1904 to the conductive contact 1908. An electrical connector 1914 electrically connects the conductive contact 1906 to the conductive layer 1810, and an electrical connector 1916 electrically connects the conductive contact 1908 to the conductive layer 1810. In an alternate embodiment, one or more electrical connectors can connect to the patterned conductive material (e.g., 1800, 1804).

Figure 20:
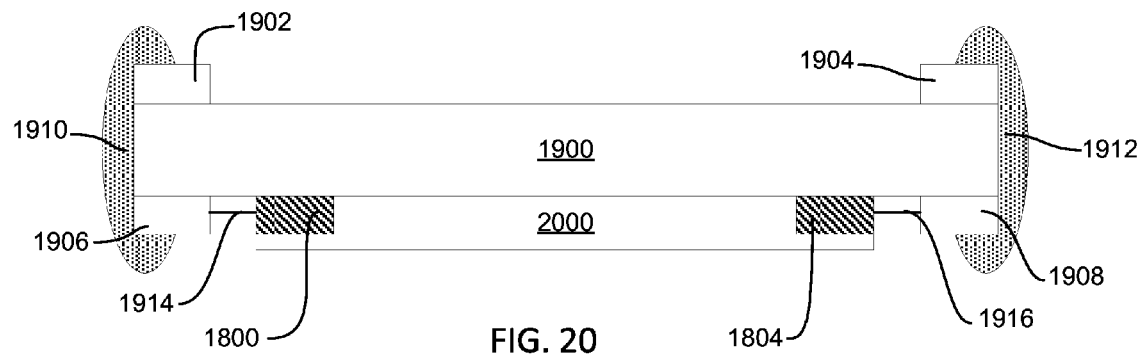
FIG. 20 depicts a cross-section view of another example of electrical connections to the conductive layer of FIG. 18 in an embodiment.

FIG. 20 depicts a cross-section view of another example of electrical connections to a conductive layer in an embodiment. Patterned conductive material (e.g., 1800, 1804) is disposed over a surface of a substrate 1900. The substrate 1900 can be any suitable type of substrate, including, but not limited to, glass.

A conductive layer 2000 is disposed over the surface of the substrate 1900 and between and/or around the patterned conductive material (e.g., 1800, 1804). The conductive layer 2000 can also be disposed over some or all of the patterned conductive material (e.g., 1800, 1804). The conductive layer 2000 and the patterned conductive material (e.g., 1800, 1804) can be made of any suitable conductive material or combination of materials.

Two conductive contacts 1902, 1904 are disposed over a first surface of the substrate 1900 and two conductive contacts 1906, 1908 are disposed over a second surface of the substrate 1900. In the illustrated embodiment, the second surface of the substrate opposes the first surface of the substrate.

Conductive material 1910 electrically connects the conductive contact 1902 to the conductive contact 1906. Likewise, conductive material 1912 electrically connects the conductive contact 1904 to the conductive contact 1908. An electrical connector 1914 electrically connects the conductive contact 1906 to the conductive layer 2000 and/or to the patterned conductive material (e.g., 1800). An electrical connector 1916 electrically connects the conductive contact 1908 to the conductive layer 2000 and/or to the patterned conductive material (e.g., 1804).

Some embodiments can use multiple electrical connections to bias the conductive layer and/or the patterned conductive material. Additionally or alternatively, one electrical connection can be used to transmit a signal to the conductive layer, and the signal can be transmitted across the conductive layer using the conductive properties of the conductive layer. With a fragmented patterned conductive material, the fragments can effectively be connected in series when using the conductive properties of the conductive layer to transmit a signal across the conductive layer.

Figure 21:
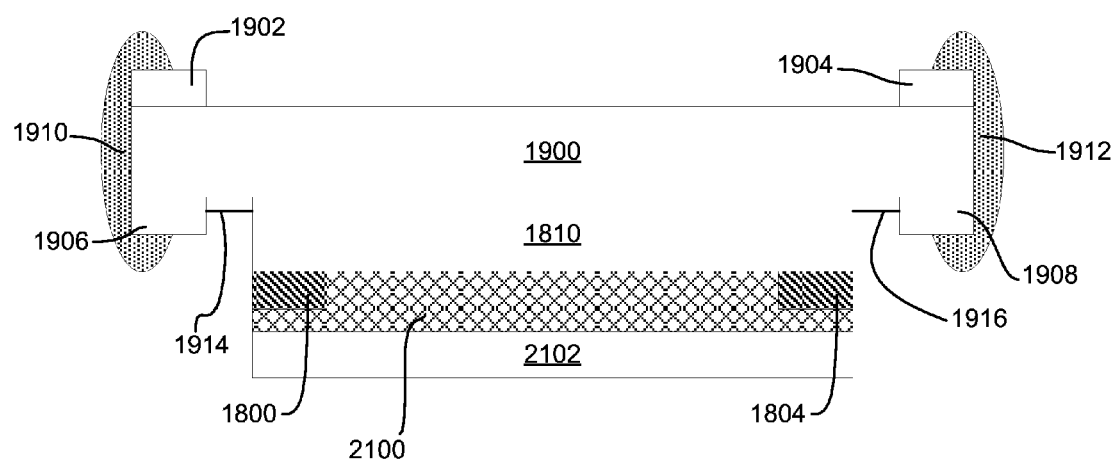
FIG. 21 illustrates one example of the substrate and the conductive layer shown in FIG. 19 connected to another layer in an embodiment.

Referring now to FIG. 21, there is shown one example of the substrate 1900 and the conductive layer 1810 shown in FIG. 19 connected to another layer in an embodiment. An adhesive layer 2100 can be used to connect layer 2102 to the conductive layer 1810 and the patterned conductive material 1800, 1804. By way of example only, the layer 2102 can be the back polarizer 314 in FIG. 3. The adhesive layer 2100 can be formed in between and/or around the patterned conductive material 1800, 1804. The adhesive layer 2100 can also extend over some or all of the patterned conductive material 1800, 1804.

The thickness of a stack of layers can be a factor in some embodiments. By way of example only, it can be desirable to minimize the thickness of the display stack shown in FIG. 3 since the display stack can be included in a handheld portable device (e.g., a smart telephone). In these embodiments, the thickness of the patterned conductive material 1800, 1804 can be determined or limited by the thickness of the adhesive layer 2100. For example, the thickness of the patterned conductive layer can be equal to, or less than a certain percentage of the adhesive layer 2100. The maximum thickness of the patterned conductive material can be, for example, ten percent of the adhesive layer.

Additionally or alternatively, when the area that includes the patterned conductive material 1800, 1804 is limited, the patterned conductive material can be formed to be thicker to maintain a given amount of resistivity. In these embodiments, the adhesive layer 2100 may need to have sufficient stickiness or viscoelastic properties to effectively bond the layer 2102 to the conductive layer 1810 and the patterned conductive material 1800, 1804.

Figure 22:
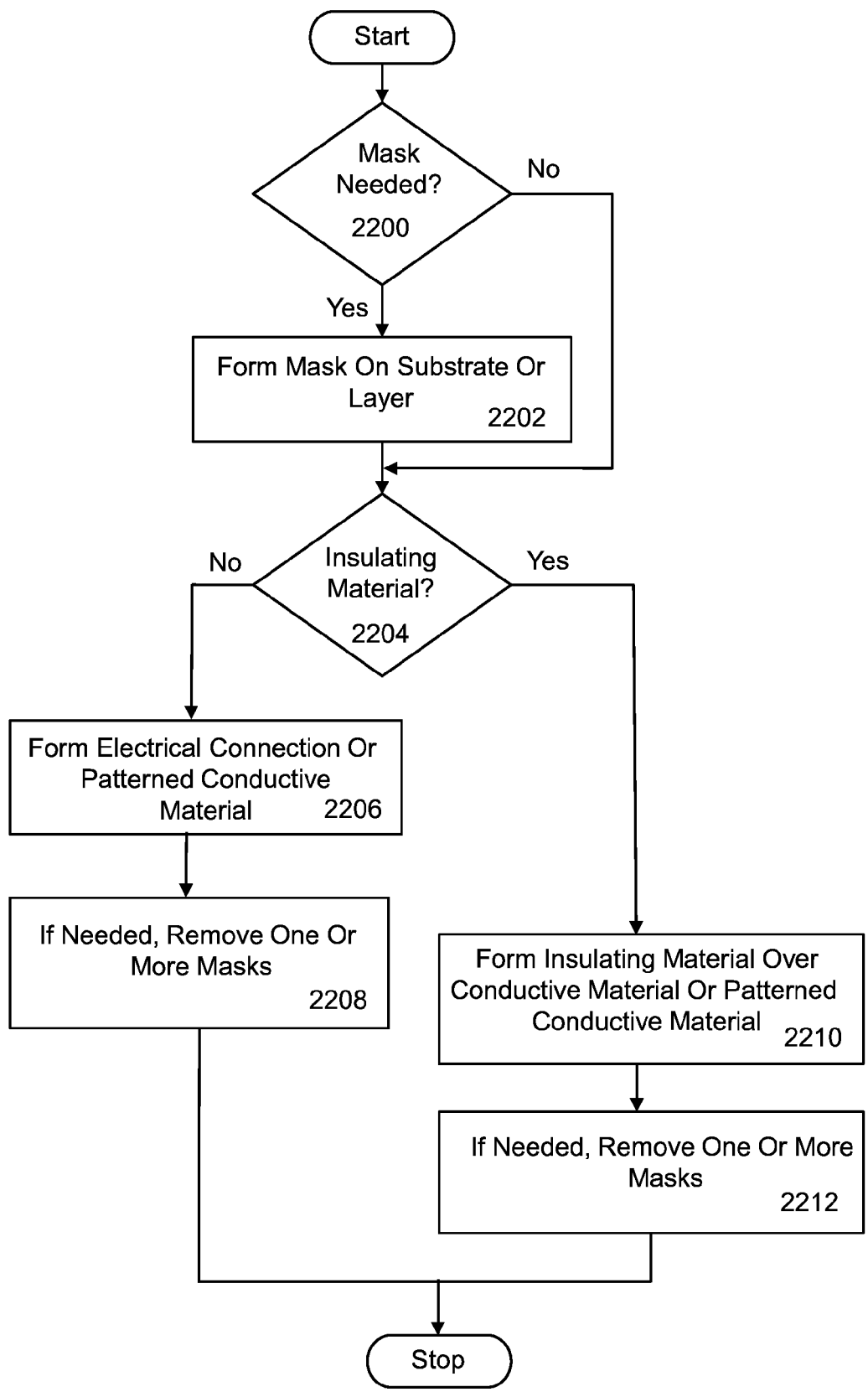
FIG. 22 is a flowchart of one example of a method for forming an electrical connection or patterned conductive material over a layer or a substrate in an embodiment.

FIG. 22 is a flowchart of one example of a method for forming an electrical connection or patterned conductive material over a layer or a substrate in an embodiment. Initially, a determination is made at block 2200 as to whether one or more masks is needed prior to forming an electrical connection or connections between conductive contacts, prior to forming patterned conductive material over a substrate or over a layer, or prior to forming insulating material over one or more conductive contacts or patterned conductive material. The mask(s) can be used to mask off previously formed components on, over, or in a substrate, or areas of a surface or surfaces where an electrical connection, patterned conductive material, or insulating material is not to be formed.

If one or more masks are needed, the method passes to block 2202 where the mask or masks are formed over the surface or surfaces of one or more substrates and/or layers. The mask can be formed over the substrate(s) or layer(s) using any suitable fabrication method. The mask can include masks that are known and used in the art.

Next, as shown in block 2204, a determination is made as to whether insulating material is to be formed on or over conductive material, a substrate, and/or a layer. If insulating material is not to be formed, the process continues at block 2206 where one or more electrical connections and/or patterned conductive materials are formed. The electrical connection(s) or patterned conductive material can be formed, for example, by dipping the substrate or layer in a conductive material. Alternatively, the patterned conductive material or electrical connection(s) can be formed by depositing conductive material on a surface or on a conductive contact. Examples of conductive materials include, but are not limited to, metal, organic materials, nanoparticles, or combinations thereof. By way of example only, the electrical connection(s) can be deposited using a chemical vapor deposition process or a physical vapor deposition process, such as sputtering. The patterned conductive material can be formed using any suitable fabrication processing, including, but not limited to, a screen printing process, photolithography, or an inkjet printing process.

In some embodiments, the conductive material used to form an electrical connection or the patterned conductive material may need to be processed (e.g., cured) at a temperature that previously formed components or attached layers can withstand. For example, the curing process, as well as other processing steps, for the conductive material 404 or the patterned conductive material 1501, 1601, 1701 can be performed at a temperature that one or more layers, such as, for example, the substrate 310, can withstand.

If necessary, the mask or masks are removed (block 2208). For example, if one or more masks were formed at block 2202, the mask(s) can be removed. In some embodiments, however, the same mask or masks can be used for multiple processing procedures.

Returning to block 2204, if insulating material is to be formed, the process continues at block 2210 where the insulating material is formed over the electrical connection and/or the patterned conductive material using any suitable method. By way of example only, the insulating material can be deposited over the conductive material that forms the electrical connection or the patterned conductive material.

If necessary, the mask or masks are removed (block 2212). For example, if one or more masks were formed at block 2202, the mask(s) can be removed. In some embodiments, however, the same mask or masks can be used for multiple processing procedures.

As described earlier, electrical connections can be formed between different conductive contacts on a single substrate, between different conductive contacts on multiple substrates, or a different type of electrical connection can be formed, such as, for example, a connection using flexible cable. The patterned conductive material can be disposed over a substrate and/or a conductive layer.

Figure 23:
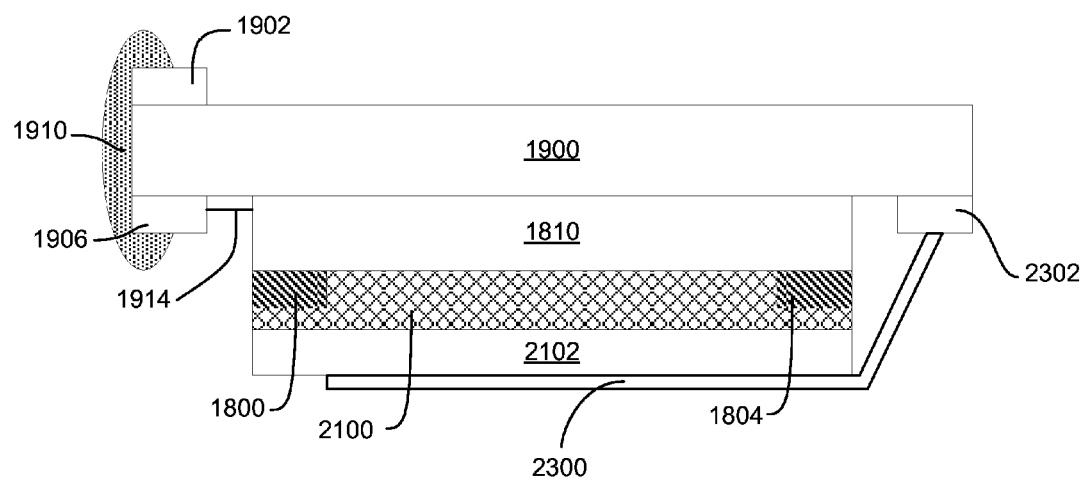
FIGS. 23-25 depict examples of a ground connection for the embodiment shown in FIG. 21.

In some embodiments, a layer is connected to a reference voltage or signal to prevent or reduce noise or other signal processing issues. For example, the back polarizer 314 in the display stack shown in FIG. 3 can be connected to a reference level, such as ground. FIG. 23 depicts one example of a ground connection for the embodiment shown in FIG. 21. A conductive adhesive layer 2300 can be used to connect the layer 2102 to a conductive contact 2302 that is connected to ground. Alternatively, the conductive adhesive layer 2300 can be connected to the conductive layer 1810, and the conductive layer 1810 can be connected to ground. The conductive adhesive can be opaque or transparent, and can be made of any suitable material or materials. One example of a conductive adhesive is a transparent or opaque conductive carbon nanotube adhesive or film.

Figure 24:
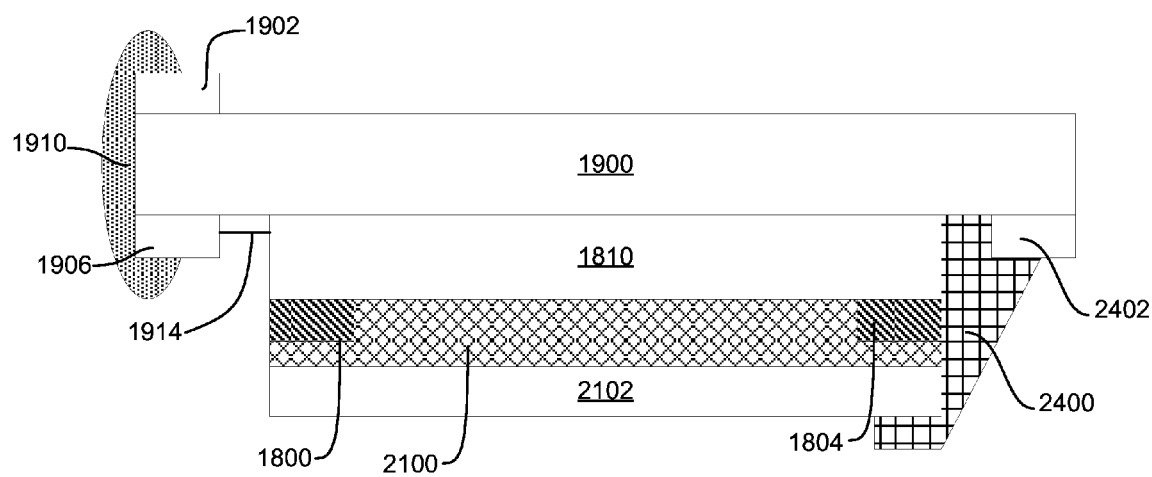

FIG. 24 illustrates another example of a ground connection for the embodiment shown in FIG. 21. Conductive material 2400 can connected the layer 2102 to a conductive contact 2402 that is connected to ground. In the illustrated embodiment, the conductive material is formed over a surface of the layer 2102 and in between the stack of layers and the conductive contact 2402. The conductive material can be any type of conductive material or combination of materials, including, but not limited to, a metal, a nanowire or nanoparticles, or a conductive foam material. In some embodiments, the layer 2102 may shrink or deform over time, so the conductive material 2400 used can be made of a flexible material to compensate for the shrinkage and/or deformation. By way of example only, in some situations the back polarizer 314 in FIG. 3 can shrink over time, so the conductive material used to connected the back polarizer to ground can be made of a flexible material.

Figure 25:
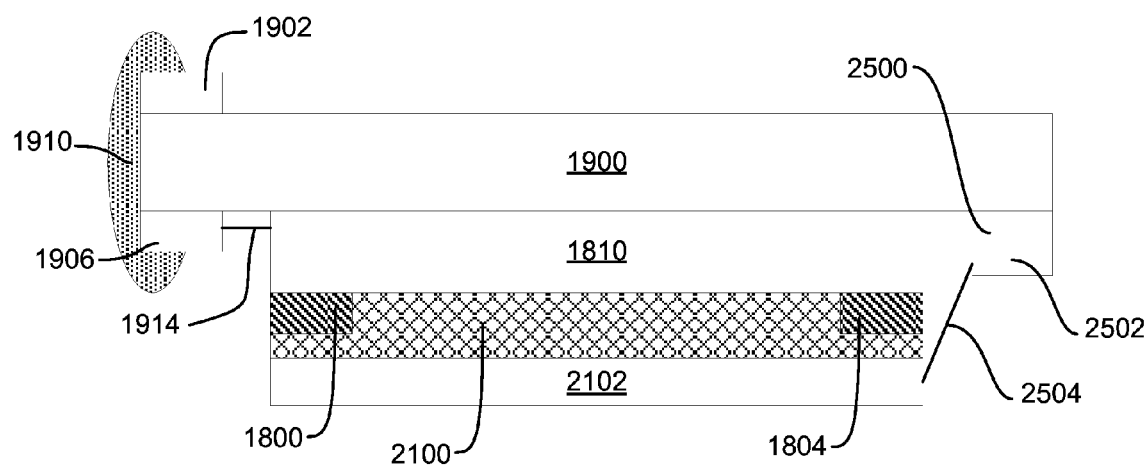

Referring now to FIG. 25, there is shown another example of a ground connection for the embodiment shown in FIG. 21. A flexible cable connector 2500 can be disposed over a surface of the substrate 1900, and a flexible cable 2502 can be connected to the cable connector 2500. The flexible cable 2502 can include a trace or signal line that is connected to ground. An electrical connector 2504 can connect the trace or signal line to the layer 2102.

Various embodiments have been described in detail with particular reference to certain features thereof, but it will be understood that variations and modifications can be effected within the spirit and scope of the disclosure. For example, the embodiments described in conjunction with FIGS. 3-5 are not limited to a display layer and a back transparent conductive layer. Electrical connections between two conductive contacts having contact surfaces that are oriented in different directions and disposed over any substrate or substrates, including, but not limited to, metal, plastic, glass, or printed circuit boards, can use embodiments described herein. Additionally or alternatively, embodiments can have or form an electrical connection between three or more conductive contacts.

Even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible.

We claim:

1. A display stack comprising:
   a substrate comprising a display layer;
   a first conductive layer positioned below the display layer;
   a first conductive contact positioned below the substrate and along an edge of the first conductive layer;
   a second conductive contact positioned above the substrate; and
   a conductive material encapsulating at least a portion of the first conductive contact and the second conductive contact and encapsulating at least a portion of an intervening edge of the substrate extending between the first and second conductive contacts.

2. The display stack of claim 1, wherein the conductive material electrically connects the first conductive contact and the second conductive contact.

3. The display stack of claim 1, wherein the first conductive layer is disposed over a portion of the first conductive contact.

4. The display stack of claim 1, further comprising a second conductive layer positioned above the display layer and adjacent the second conductive contact, the second conductive layer electrically connected to the second conductive contact.

5. The display stack of claim 4, further comprising an electrical connector electrically connecting the second conductive layer to the second conductive contact.

6. The display stack of claim 5, wherein the conductive material electrically connects the first conductive layer and the second conductive layer via the first conductive contact and the second conductive contact, respectively.

7. The display stack of claim 1, wherein the conductive material is disposed over a portion of the substrate.

8. An electronic device comprising:
   a display stack comprising:
      a substrate comprising a liquid crystal display (LCD) layer;
      a conductive layer positioned below the LCD layer;
      a first conductive contact positioned below the substrate and along a side of the LCD layer;
      a second conductive contact positioned above the substrate; and
      a conductive material encapsulating at least a portion of the first conductive contact and the second conductive contact and encapsulating at least a portion of an edge of the LCD layer.

9. The electronic device of claim 8, further comprising:
   a patterned conductive material disposed over one of:
      at least a portion of the conductive layer, or
      at least a portion of the substrate such that the conductive layer is disposed over the patterned conductive material.

10. The electronic device of claim 9, further comprising an electrical connector electrically connecting the conductive layer to the first conductive contact.

11. The electronic device of claim 9, further comprising an electrical connector electrically connecting the patterned conductive material disposed over at least a portion of the substrate to the first conductive contact.

12. The electronic device of claim 9, wherein the patterned conductive material includes a resistivity that is lower than a resistivity of the conductive layer.

13. The electronic device of claim 9, wherein the patterned conductive layer is disposed over at least a portion of a perimeter of the conductive layer.

14. The electronic device of claim 9, further comprising a layer disposed over at least a portion of the conductive layer and at least a portion of the patterned conductive material disposed over the conductive layer.

15. The electronic device of claim 14, further comprising a third conductive contact positioned below the substrate,
wherein the third conductive contact is electrically connected to the layer disposed over at least the portion of the conductive layer and at least the portion of the patterned conductive material disposed over the conductive layer.

16. The electronic device of claim 9, wherein the patterned conductive material is fragmented.

17. The electronic device of claim 16, wherein the conductive layer is disposed around the fragmented patterned conductive material disposed over at least the portion of the substrate.

* * * * *